United States Patent [19]

Seefeldt

[11] Patent Number: 5,088,601
[45] Date of Patent: Feb. 18, 1992

[54] CIRCUIT BOARD SHIPPING CARTON
[75] Inventor: Roger L. Seefeldt, Oklahoma City, Okla.
[73] Assignee: AT&T Bell Laboratories, Murray Hill, N.J.
[21] Appl. No.: 740,220
[22] Filed: Aug. 5, 1991
[51] Int. Cl.$^5$ .................. B65D 85/30; B65D 73/02
[52] U.S. Cl. .................. 206/334; 229/40; 229/168
[58] Field of Search .......... 206/334, 328, 424, 491, 206/454; 229/40, 168

[56] References Cited

U.S. PATENT DOCUMENTS

| | | | |
|---|---|---|---|
| 3,385,502 | 5/1968 | Pilger | 229/40 |
| 3,871,572 | 3/1975 | Skaggs | 206/424 X |
| 4,160,503 | 7/1979 | Ohlbach | 206/328 |
| 4,211,324 | 7/1980 | Ohlbach | 206/328 |
| 4,231,472 | 11/1980 | Dlugopolski | 229/40 X |
| 4,593,813 | 6/1986 | Powel | 206/328 |
| 4,792,042 | 12/1988 | Koehn et al. | 206/328 |
| 4,823,954 | 4/1989 | Chevalier | 229/40 X |
| 4,915,222 | 4/1990 | Reidinger et al. | 206/328 |
| 5,002,188 | 3/1991 | Dickie | 206/589 |

OTHER PUBLICATIONS

Product brochure entitled "PROTECH ® Packaging for the Electronics Industry" by General Packaging Corporation, Richardson, Texas.

Primary Examiner—Paul T. Sewell
Assistant Examiner—Jacob K. Ackun, Jr.
Attorney, Agent, or Firm—D. A. Marshall

[57] ABSTRACT

A carton for use in shipping circuit boards. The carton has a pair of side members separated by top and bottom members configured to surround a circuit board with a closed end opposite an open end for receiving the circuit board. The closed end consists of three panels with one panel positioned perpendicular to the side members and a middle panel inserted into the carton cavity parallel to one side member with the remaining panel formed at an acute angle with respect to the middle panel inside the carton cavity to engage and position a circuit board within the carton to prevent movement thereof. A segment formed at the open end across the top member to extend partially down each side member is formed such that one side section rotates with respect to a side member so that a top section may be positioned parallel to the side member with the other side section positioned across the open end to retain the circuit board within the carton.

4 Claims, 3 Drawing Sheets

CIRCUIT BOARD SHIPPING CARTON

TECHNICAL FIELD

The invention relates to packaging apparatus and in particular to a carton for protecting a circuit board in shipment from one location to another.

BACKGROUND AND PROBLEM

Electronic apparatus is oftentimes constructed by assembling circuit boards into backplanes that are formed to electrically interconnect circuitry of circuit boards to form the electronic apparatus. In a typical application, electronic apparatus frames on which the backplanes are mounted are shipped to a customer location along with the circuit boards which are packaged in separate and independent cartons. At a customer location, the electronic apparatus is assembled by removing each circuit board from its carton and installing the circuit board by plugging it into the backplane to complete assembly of the electronic apparatus.

Subsequently, the electronic apparatus may be updated or new features may be added by ordering additional and new circuit boards. Each additional or new circuit board is shipped in a carton to the customer location. Upon receiving the circuit board, the customer removes it from the carton and plugs it into the frame backplane to update the electronic apparatus. The carton may be used a number of times duing its lifetime to return a circuit board to a repair facility, to store the circuit board until required for use or to ship circuit boards to various customer locations.

A typical circuit board shipping carton generally has a pair of side members separated by top and bottom members and is formed to surround a circuit board. The carton has a closed end with an opposite open end for receiving the circuit board. A segment located across the top and extending down one side member of the carton open end has two sections consisting of a top and side section having identical widths. After the circuit board is inserted into the carton, the top section is formed downward into a position parallel to the other side member with the side section positioned across the open end to retain the circuit board within the carton. A closed end is formed opposite the open end with one side member formed with two panels wherein one panel is formed at right angles with respect to both side members with the other panel inserted into the carton such that a pair of tabs may each be positioned through slots located in the top and bottom members so that the other panel is positioned parallel and adjacent one side member.

A problem arises in that a circuit board inserted into the carton is free to move within the carton thereby resulting in damage when the circuit board is shipped between locations. Another problem arises in that the act of forcing the top and side segment downward to lock the circuit board within the carton deforms and buckles the other side member thereby rendering the carton useless after several uses. Accordingly, a need exists for a carton which prevents movement of a circuit board within the carton while shipping the circuit board between locations and which carton may be used a large number of times to ship the circuit board between locations.

SOLUTION

The foregoing problems are solved by a carton having a pair of parallel side member separated by top and bottom members and which carton is designed to receive a circuit board and both secure and retain the received circuit board within the carton. The carton has an open end at one end of the side, top and bottom members for receiving the circuit board. A segment is formed at the open end across the top member to extend down both adjacent side members. The segment has three sections with a top and one side section adjacent the top section having identical widths. The other side section has a width less than the top and one side section width and is formed with a crease line separating the other side section from the adjacent side member. The crease line enables rotations of the other side section thereabout so that the top section may be positioned parallel to the adjacent side member with the one side positioned across the open end to retain the circuit board within the carton. A closed end is located opposite the open end with one side member formed with a center tab. The other side member is formed with three panels opposite the center tab wherein a first panel is formed at right angles with respect to both side members when a middle panel is inserted into the carton and positioned parallel and adjacent the one side member. A third panel having a width greater than the other two panels is formed at an acute angle with respect to the middle panel to extend into the cavity between the side members and a center slot is formed in a partially perforated line separating the first panel from the middle panel to receive the center tab. When the center tab is engaged with the center slot, the third panel is positioned to engage a circuit board inserted into the carton and thereby prevent movement thereof.

DETAILED DESCRIPTION

Figure 1:
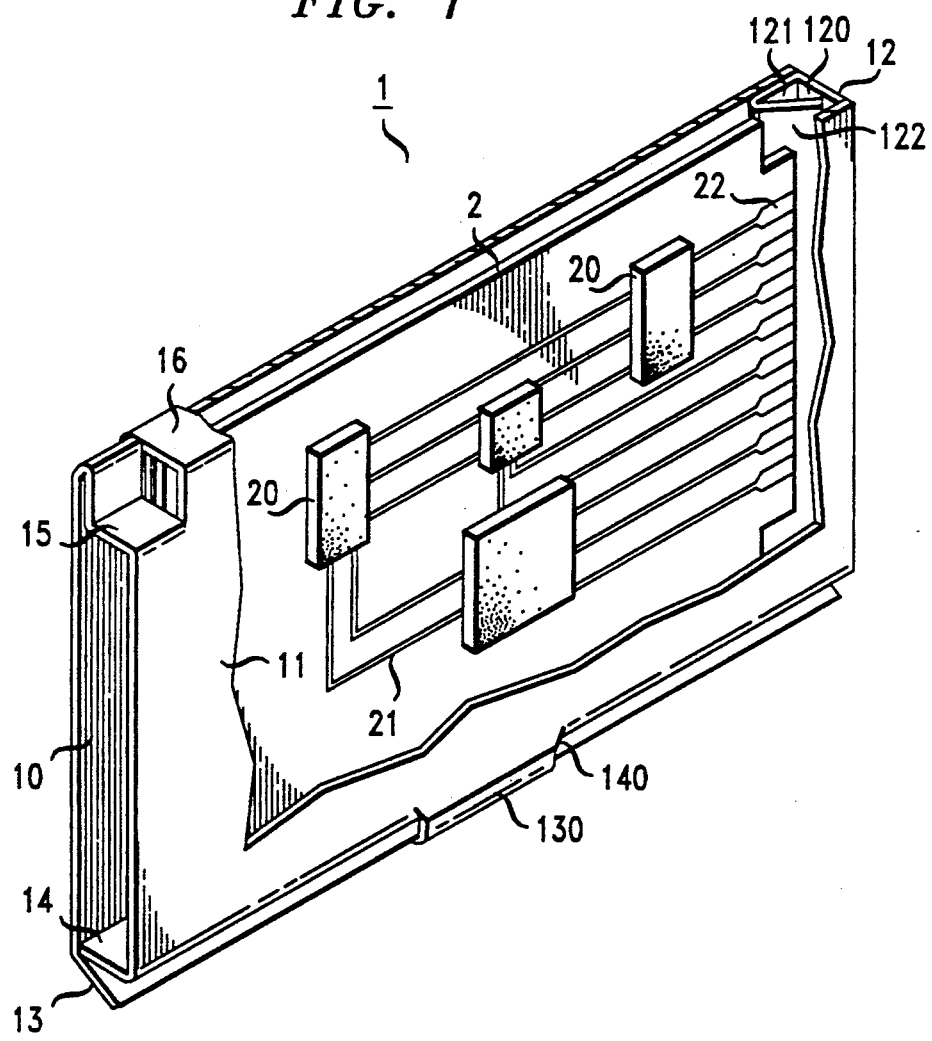
FIG. 1 is an oblique view of a carton for shipping circuit boards in accordance with the principles of the invention.

In an exemplary embodiment of the invention, FIG. 1, carton 1 is intended for use in protecting a circuit board 2 when storing or shipping circuit board 2 between locations. Typically, circuit board 2 mounts electronic and electrical components 20 which may be microprocessor components, logic circuit arrays, resistor, capacitors, dual in-line packages and other types of components which are interconnected by conducting paths 21 with contact fingers 22. Carton 1 has a pair of parallel side members 10, 11 separated by top member 16 and bottom members 13, 14. One end is closed and functions to prevent movement of circuit board 2 inserted into carton 1. The opposite end is open to receive circuit board 2 and is functional to secure circuit board 2 within carton 1.

Figure 2:
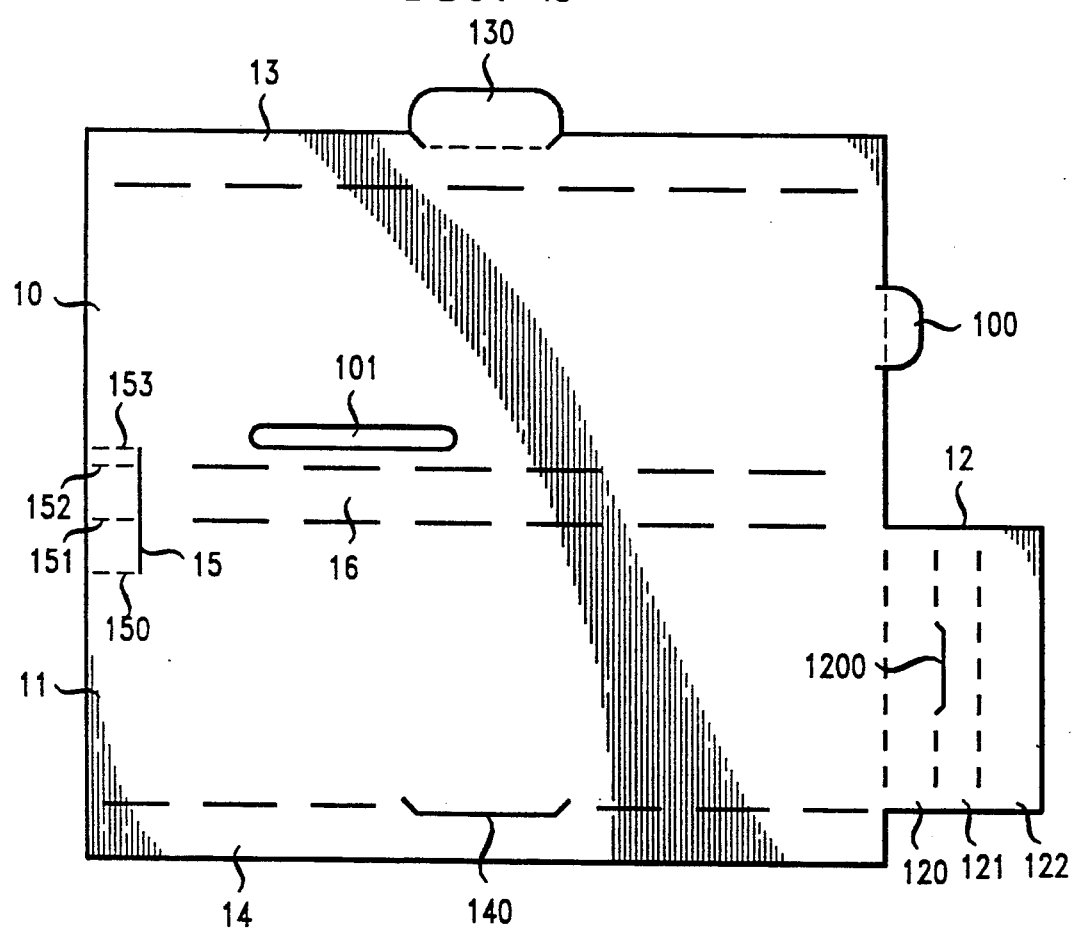
FIG. 2 is a template illustration of the circuit board shipping carton set forth in FIG. 1, FIG. 3, 4 and 5 illustrate the open end structure of the carton set forth in FIGS. 1 and 2 and the operation thereof for retaining a circuit board within the carton, and FIG. 6 illustrate the closed end structure of the carton set forth in FIGS. 1 and 2.
Figure 3:
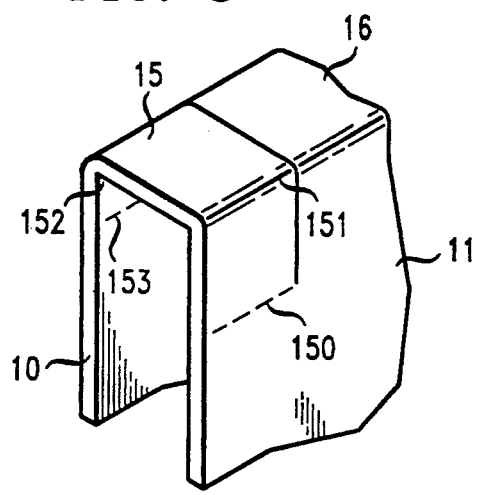

The open end is located at one end of side members 10, 11 to have a segment with three sections with a top section, FIG. 2, and one side section adjacent the top section having identical widths. The other side section has a width less than the width of the top and one side section and is formed with a crease line 153 separating the other side section from adjacent side member 10. In operation, FIGS. 3, 4, 5, the one side section is forced in toward the carton cavity such that the one side section and top section lie in the same plane thereby forcing the the other side section to rotate outward from side member 10 about crease line 153. Continued force applied to the one side section forces the top section to be positioned parallel to side member 10, FIG. 5, with the other side section rotated inwardly about crease line 153 with the one side section positioned across the open end and perpendicular to side member 10, 11 to retain circuit board 2 within carton 1.

Figure 6:
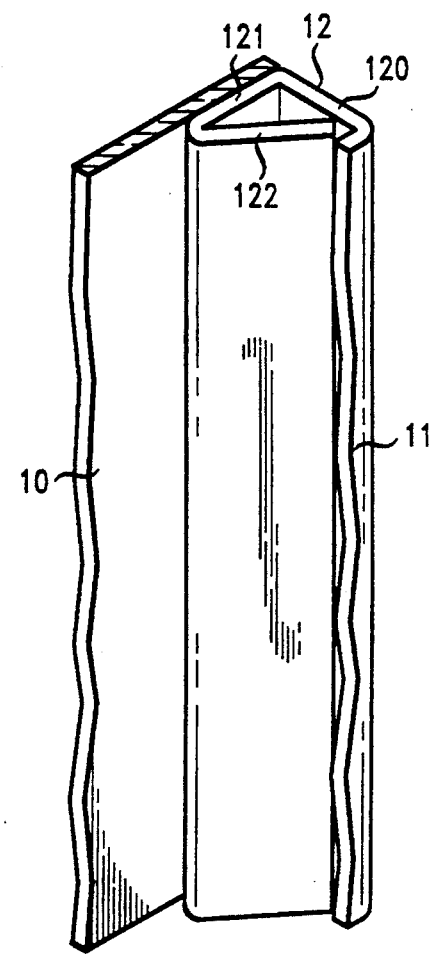

Carton 1, FIG. 1, has a closed end opposite the end to both hold circuit board 2 within carton 1 and to prevent movement of circuit board 2 during shipment. One side member 10, FIG. 2, is formed with a center tab 100. The other side member 11 is formed to have three panels 120, 121, 122 opposite center tab 100 wherein a first panel 120, FIG. 6, is formed at right angle with respect to both side members 10, 11 with a middle panel 121 inserted into carton 1 and positioned parallel and adjacent to side member 10. A third panel 122 having a width greater than the width of panels 120, 121 is formed at an angle with respect to middle panel 121 to extend into the cavity between side member 10, 11. A center slot 1200, FIG. 2, formed in a partially perforated line separating first panel 120 from middle panel 121, receives center tab 100 to form the closed end with third panel 122, FIG. 6, positioned to engage and position circuit board 2, FIG. 1, inserted into carton 1 to prevent movement thereof.

Each side member 10, 11, FIG. 2, has a bottom panel 13, 14 separated from the corresponding side member 10, 11 by partially perforated lines enabling each bottom panel 13, 14 to be formed at a right angle with respect to an adjacent side panel 10, 11. One bottom panel 14, FIG. 1, is positioned inside the other bottom panel 13 such that a central slot 140, FIG. 2, formed along a partially perforated line separating bottom panel 14 from adjacent side panel 11 receives a central tab 130 located on the outer edge of bottom panel 13 adjacent side member 10 to form a rectangular cavity with top and side members 16, 10, 11 for receiving circuit board 2.

One of the side members, for example side member 10, may have an elongnated slot 101 positioned so as to enable a serial number affixed to a side of circuit board 2 to be viewed from outside carton 1 without having to remove circuit board 2.

As set forth in FIG. 2, carton 1 comprises a generally rectangular configured member formed of corrugated fiberboard to absorb external shocks applied to carton 1 in transit. Carton 1 has sections 10, 11, 12, 13, 14 with each section separated from an adjacent section from an adjacent section by a partially perforated line to form a top member 16 positioned between a pair of side members 10, 11 formed perpendicularly with respect to top member 16. In addition each side member 10, 11 has a corresponding bottom panel 13, 14 separated from the adjacent side member 10, 11 by a partially perforated line enabling each bottom panel 13, 14 to be formed perpendicularly with respect to its adjacent side member 10, 11. During assembly, one bottom panel 14 is positioned inside the other bottom panel 13. Bottom panel 14 has a central slot 140 formed along the partially perforated ling separating bottom panel 14 from adjacent side panel 11 such that a central tab 130 corresponding with central slot 140 and which is positioned on an outer edge of bottom panel 13 can be engaged with central slot 140 to form carton 1 having a rectangular configured cavity for receiving circuit board 2.

As earlier set forth, one side member 10 has a center tab 100 formed at one end of carton 1 opposite the open end. The other side member 11 has a corresponding end formed of three panels 120, 121, 122 with panel 120 separated from side member 11 and each panel separted from an adjacent panel by partially perforated lines. Thus, the closed end of the carton 1, FIG. 6, is formed by positioning panel 120 at right angles in respect to side members 10, 11 with panel 121 inserted into the carton cavity parallel to and adjacent side member 10. The third panel 122, having a width greater than panel 120, 121, is formed at an angle with respect to panel 121 to extend into the cavity between side members 10, 11 to engage circuit board 2 inserted into carton 1 and to prevent movement of circuit board 2.

Figure 4:
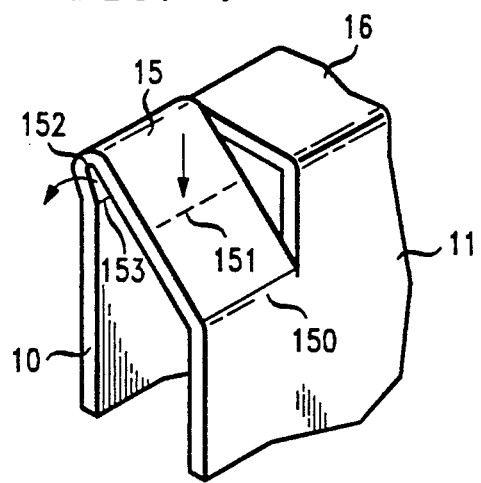
Figure 5:
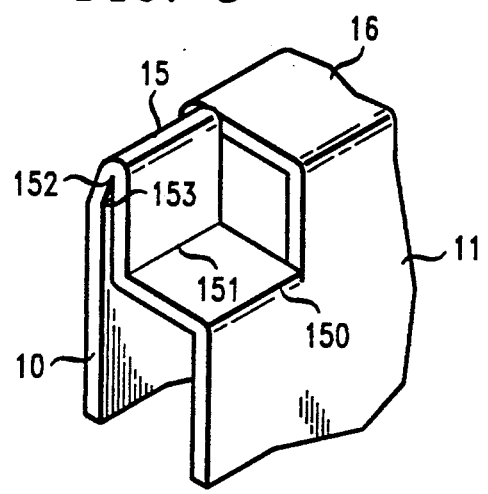

A segment 15, FIG. 2, is formed at the open end of carton 1 across top member 16 and extends partially down each side member 10, 11 to have three sections each partitioned from an adjacent section and side member by parallel crease lines 150, 151, 152, 153 formed perpendicular to the open end. Segment 15 is separated by a cut line positioned perpendicular to each crease line and parallel to the open end with a top section and one side member section adjacent the top section having an identical width greater than a width of the other side section. In operation, FIGS. 3, 4, 5, a force is applied to the side section corresponding with side member 11 such that the top section and the side section are positioned as shown in FIG. 4. As the side section corresponding with side member 11 is moved into the carton cavity and the top section moves down into the cavity, the opposing side section rotates outward with respect to side member 10 about crease line 153. As the force is continued to be applied to the side section, the side section corresponding with side member 10 is rotated slightly in toward the carton cavity thereby enabling the top section to be finally positioned parallel to side member 10 with the other side section positioned across the open end to retain circuit board 2 within carton 1. Such construction enables carton 1 to be reused many times to both store and ship circuit boards.

I claim:

1. A carton having a pair of parallel side members separated by top and bottom members for receiving a circuit board wherein the carton comprises an open end at one end of the side, top and bottom member for receiving the circuit board and formed with a segment across the top and extending down the side members to have three sections with a top and one side section adjacent the top section having identical widths and with the other side section having a width less than the top and one side section width and formed with a crease line separating the other side section from an adjacent side member enabling rotation of the other side section thereabout so that the top section may be positioned parallel to the adjacent side member with the one side section across the open end to retain the circuit board within the carton; and a closed end opposite the open end with one side member formed with a center tab and the other side member formed with three panels opposite the center tab wherein a first panel is formed at right angle with respect to both side members with a middle panel inserted into the carton and positioned parallel and adjacent the one side member and wherein a third panel having a width greater than the other panels is formed at an acute angle with respect to the middle panel to extend into the space between the side members and wherein a center slot is formed in a perfortated line separating the first panel from the middle panel to receive the center tab with the third panel positioned to engage and position a circuit board inserted into the carton and thereby prevent movement thereof.

2. The carton set forth in claim 1
wherein each side member has a bottom panel separated therefrom by another partially perforated line enabling each bottom panel to be formed at a right angle with respect to the adjacent side panel with one bottom panel positioned inside the other bottom panel wherein the one bottom panel has a central slot formed along the other partially perforated line separating the one bottom panel from the adjacent side panel and wherein the other bottom panel has a central tab positioned on an edge of said other bottom panel to engage the corresponding central slot and form a carton having a rectangular cavity for receiving the circuit board.

3. The carton set forth in claim 1
wherein one of the pair of side members has an elongated slot positioned thereon to enable a serial number affixed to a side of the circuit board to be viewed from outside the carton without having to remove the circuit board therefrom.

4. A carton having a pair of parallel side members separated by top and bottom members for receiving a circuit board wherein the carton comprises an open end at one end of the side, top and bottom members for receiving the circuit board and formed with a segment across the top and extending down the side members to have three sections with a top and one side section adjacent the top section having identical widths and with the other side section having a width less than the top and one side section width and formed with a crease line separating the other side section from an adjacent side member enabling rotation of the other side section thereabout so that the top section may be positioned parallel to the adjacent side member with the one side section positioned across the open end to retain the circuit board within the carton;

a closed end opposite the open end with one side member formed with a center tab and the other side member formed with three panels opposite the center tab wherein a first panel is formed at right angle with respect to both side members with a middle panel inserted into the carton and positioned parallel and adjacent the one side memberr and wherein a third panel having a width greater than the other panels is formed at an acute angle with respect to the middle panel to extend into a cavity between the side members and wherein a center slot is formed in a perforated line separating the first panel from the middle panel to receive the center tab with the third panel positioned to engage and position a circuit board inserted into the carton and thereby prevent movement thereof;

a pair of bottom panels each separated from an adjoining side member by other partially perforated lines enabling each bottom panel to be formed at a right angle with respect to the adjoining side member with one bottom panel positioned inside the other bottom panel wherein the one bottom panel has a central slot formed along one of the other partially perforated lines separating the one bottom panel from the adjoining side member and wherein the other bottom panel has a central tab corresponding with said other bottom member central slot and positioned on an edge of said other bottom panel to engage the corresponding central slot and form a rectangular cavity for receiving the circuit board; and an elongated slot positioned on one of the side members to enable a serial number affixed to a side of the retained circuit board to be viewed from outside the carton without having to remove the circuit board thereform.

* * * * *

UNITED STATES PATENT AND TRADEMARK OFFICE
CERTIFICATE OF CORRECTION

PATENT NO. : 5,088,601

DATED : February 18, 1992

INVENTOR(S) : Roger L. Seefeldt

It is certified that error appears in the above-identified patent and that said Letters Patent is hereby corrected as shown below:

Column 1, line 30, "duing" should be --during--; and

Column 1, line 43, "formed" should be --forced--.

Column 2, line 4, "member" should be --members--; and

Column 2, line 17, "rotations" should be --rotation--.

Column 3, line 15, "member" should be --members--;

Column 3, line 28, after "an" insert --acute--; and

Column 3, line 62, after "addition" insert --,--.

Column 4, line 2, "ling" should be --line--.

In the Claims:

Column 4, line 65, after "section" insert --positioned--.

Column 6, line 14, "memberr" should be --member--.

Signed and Sealed this

Sixth Day of July, 1993

*Attest:*

MICHAEL K. KIRK

*Attesting Officer*

*Acting Commissioner of Patents and Trademarks*